United States Patent
DiJaili et al.

(10) Patent No.: US 6,560,010 B1
(45) Date of Patent: May 6, 2003

(54) BROADBAND GAIN-CLAMPED SEMICONDUCTOR OPTICAL AMPLIFIER DEVICES

(75) Inventors: Sol P. DiJaili, Moraga, CA (US); Jeffrey D. Walker, El Cerrito, CA (US); Frank G. Patterson, Danville, CA (US)

(73) Assignee: Genoa Corporation, Fremont, CA (US)

( * ) Notice: Subject to any disclaimer, the term of this patent is extended or adjusted under 35 U.S.C. 154(b) by 0 days.

(21) Appl. No.: 10/016,954

(22) Filed: Dec. 13, 2001

Related U.S. Application Data
(60) Provisional application No. 60/255,753, filed on Dec. 14, 2000.

(51) Int. Cl.$^7$ .................................................. H01S 3/00
(52) U.S. Cl. ...................................... 359/344; 359/337
(58) Field of Search ................................ 359/344, 337; 372/43

(56) References Cited

U.S. PATENT DOCUMENTS

| | | | |
|---|---|---|---|
| 3,467,906 A | 9/1969 | Cornely et al. | 330/4.3 |
| 3,828,231 A | 8/1974 | Yamamoto | 357/30 |
| 4,794,346 A | 12/1988 | Miller | 330/4.3 |
| 5,436,759 A | 7/1995 | Dijaili et al. | 359/333 |
| 5,654,822 A | * 8/1997 | Ducellier et al. | 359/344 |
| 5,673,141 A | * 9/1997 | Gambini | 359/341 |
| 6,115,517 A | 9/2000 | Shiragaki et al. | 385/24 |

FOREIGN PATENT DOCUMENTS

| | | | |
|---|---|---|---|
| JP | 56006492 | 1/1981 | H01S/3/18 |
| JP | 02000012978 A | * 1/2000 | |

OTHER PUBLICATIONS

Wolfson et al, "Detailed Theoretical Investigation of the Input Power Dynamic Range for Gain–Clamped Semiconductor Optical Amplier Gates at 10 Gb/s" 1998, IEEE Photonics Technology Letters, vol. 10, No. 9 pp 1241–1243.*

Alcatel, "Alcatel Optronics Introduces a Gain–Clamped Semiconductor Optical Amplifier," *Press Release for Immediate Publication*, OFC '98, San Jose, 1 unnumbered page, (Feb. 1998).

Dorgeuille, F., Noirie, L., Faure, J–P., Ambrosy, A., Rabaron, S., Boubal, F., Schilling, M., and Artigue, C., "1.28 Tbit/s Throughput 8×8 Optical Switch Based on Arrays of Gain–Clamped Semiconductor Optical Amplifier Gates," Optical Fiber Communication Conference, vol. 4, pp. 221–223, Mar. 2000.

Dorgeuille, F., Lavigne, B., Emery, J.Y., Di Maggio, M., Le Bris, J., Chiaroni, D., Renaud, M., Baucknecht, R., Schneibel, H.P., Graf, C., and Melchior, H., "Fast Optical Amplifier Gate Array for WDM Routing and Switching Applications," OFC '98 Technical Digest, pp. 42–44, 1998.

(List continued on next page.)

*Primary Examiner*—Mark Hellner
(74) *Attorney, Agent, or Firm*—Fenwick & West LLP (57) ABSTRACT

A broadband semiconductor optical amplifier (SOA) device includes at least two gain-clamped SOAs having different spectral responses. The gain-clamped SOAs are coupled so that the broadband SOA device has a spectral response which is not attainable by any one of the gain-clamped SOAs. The gain-clamped SOAs may be coupled in different ways. For example, they may be coupled in parallel, in series, or in another different and/or more complex ways. In one implementation, the gain-clamped SOAs are vertically lasing semiconductor optical amplifiers.

22 Claims, 10 Drawing Sheets

OTHER PUBLICATIONS

Doussiere, P., Jourdan, A., Soulage, G., Garabédian, P., Graver, C., Fillion, T., Derouin, E., and Leclerc, D., "Clamped Gain Travelling Wave Semiconductor Optical Amplifier for Wavelength Division Multiplexing Application," IEEE, US, vol. Conf. 14, pp. 185–186, New York, Sep. 14, 1994.

Jeong, G., and Goodman, J.W., "Gain Optimization in Switches Based on Semiconductor Optical Amplifiers," Journal of Lightwave Technology, vo. 13, No. 4, pp. 598–605, Apr. 1995.

McAdams, L.R., Weverka, R.T., and Cloonan, J., "Linearizing High Performance Semiconductor Optical Amplifiers: Techniques and Performance," LEOS Presentation, pp. 363–364, 1996.

Mutalik, V. G., van den Hoven, G., and Tiemeijer, L., "Analog Performance of 1310–nm Gain–Clamped Semiconductor Optical Amplifiers," OFC '97 Technical Digest, pp. 266–267, 1997.

Soulage, G., Doussière, P., Jourdan, A., and Sotom, M., "Clamped Gain Travelling Wave Semiconductor Optical Amplifier as a Large Dynamic Range Optical Gate," Alcatel Alsthom Recherche, route de Nozay, 91460 Marcoussis (France), 4 unnumbered pages, undated.

Tai, C., and Way, W.I., "Dynamic Range and Switching Speed Limitations of an N×N Optical Packet Switch Based on Low–Gain Semiconductor Optical Amplifiers," IEEE Journal of Lightwave Technology, vol. 14, No. 4, pp. 525–533, Apr. 4, 1996.

Tiemeijer, L.F., Thijs, P.J.A., Dongen, T.v., Binsma, J.J.M. Jansen, E.J., van Helleputte, H.R.J.R., "Reduced Intermodulation Distortion in 1300 nm Gain–Clamped MQW Laser Amplfiers," IEEE Photonics Technology Letters, vol. 7, No. 3, pp. 284–286, Mar. 1995.

Toptchiyski, G., Kindt, S., and Petermann, K., "Time–Domain Modeling of Semiconductor Optical Amplifiers for OTDM Applications," IEEE Journal of Lightwave Technology, vol. 17, No. 12, pp. 2577–2583, Dec. 1999.

* cited by examiner

FIG. 8C

BROADBAND GAIN-CLAMPED SEMICONDUCTOR OPTICAL AMPLIFIER DEVICES

CROSS-REFERENCE TO RELATED APPLICATION

This application claims the benefit of U.S. Provisional Patent Application Ser. No. 60/255,753, "Optical Devices including a Semiconductor Optical Amplifier", by Jeffrey D. Walker, Sol P. Dijaili, et al., filed Dec. 14, 2000, which subject matter is incorporated herein by reference.

BACKGROUND OF THE INVENTION

1. Field of the Invention

This invention relates generally to broadband optical amplifier devices. More particularly, it relates to broadband optical amplifier devices based on combinations of gain-clamped semiconductor optical amplifiers (SOAs), such as vertically lasing semiconductor optical amplifiers (VLSOAs).

2. Description of the Related Art

Optical amplifiers, which boost the power of optical signals, are a basic building block for many types of optical systems. For example, fiber optic communications systems transmit information optically at very high speeds over optical fibers. A typical communications system includes a transmitter, an optical fiber, and a receiver. The transmitter incorporates information to be communicated into an optical signal and transmits the optical signal via the optical fiber to the receiver. The receiver recovers the original information from the received optical signal. In these systems, phenomena such as fiber losses, losses due to insertion of components in the transmission path, and splitting of the optical signal may attenuate the optical signal and degrade the corresponding signal-to-noise ratio as the optical signal propagates through the communications system. Optical amplifiers are used to compensate for these attenuations.

Fiber amplifiers are one type of optical amplifier. They include a length of fiber which has been doped to form an active gain medium. Ions of rare-earth metals, such as erbium, are typically used as the dopant. The doped fiber is typically pumped by an optical pump at a wavelength which is preferentially absorbed by the ions but different from the wavelength of the optical signal to be amplified. The pumping results in a population inversion of electronic carriers in the active medium. Then, as the optical signal propagates through the doped fiber, it is amplified due to stimulated emission.

One drawback of fiber amplifiers is that they typically can only operate over a narrow wavelength range, especially when multiple fiber amplifiers are cascaded. This is especially problematic if the optical signal to be amplified covers a wide range of wavelengths, as would be the case if the entire bandwidth of the optical fiber is to be efficiently utilized. For example, single mode optical fiber is currently used in many fiber optic communications systems due to its good performance, particularly for high data rates over long distances. Present-day single mode fiber has low attenuation over the 1200 to 1650 nm wavelength range and, therefore, could support the transmission of optical signals over this entire wavelength range. However, erbium doped fiber amplifiers (EDFAs), which are the current amplifiers of choice for such systems, have a gain profile that limits their use to the approximately 1530 to 1565 nm wavelength range. This EDFA limitation means that only approximately 10% of the single mode fiber's inherent capacity is currently utilized. The other 90% lies unused. Considerable effort has been expended to increase the wavelength range of EDFAs. However, in the near future, it appears that these efforts will at best expand the useable wavelength window to about 100 nm, or 25% of single mode fiber's inherent capacity. Other disadvantages of fiber amplifiers include their relatively large size, slow switching speed, power inefficiency, difficulties in mass producing them, and their high cost which makes them prohibitively expensive for many applications.

Semiconductor optical amplifiers (SOAs) are another type of optical amplifier. SOAs contain a semiconductor active region and an electrical current typically is used to pump the electronic population in the active region. An optical signal propagating through the active region experiences gain due to stimulated emission. Conventional SOAs are non-lasing. One problem with non-lasing semiconductor optical amplifiers is that the gain depends on the amplitude of the optical signal. This problem is the result of gain saturation, in which there are insufficient carriers in the conduction band to provide the full amount of gain to higher power signals. As a result, a strong optical signal will be amplified less than a weak signal and strong portions of the optical signal will be amplified less than weak portions. This results in distortion of the optical signal and also crosstalk between different optical signals propagating simultaneously through the system (e.g., at different wavelengths). This significantly limits the use of conventional SOAs in broadband applications.

Thus, there is a need for optical amplifier devices which can operate over a broad wavelength range. There is also a need for optical amplifier devices which are small in size, easy to manufacture and easily integrable with other components. There is also a need for optical amplifier devices which do not suffer from gain saturation.

SUMMARY OF THE INVENTION

In accordance with the present invention, a broadband semiconductor optical amplifier (SOA) device includes at least two gain-clamped SOAs having different spectral responses. The gain-clamped SOAs are coupled so that the broadband SOA device has a spectral response which is not attainable by any one of the gain-clamped SOAs. The gain-clamped SOAs may be coupled in different ways. In one implementation, they are coupled in parallel. In another, they are coupled in series. Other types of couplings, including more complex ones, are also possible. For example, the broadband SOA device may include a number of stages, each of which includes a number of gain-clamped SOAs.

In another aspect of the invention, the broadband SOA device has a passband which is broader than the individual passbands of the gain-clamped SOAs. In another implementation, the passband of one of the gain-clamped SOAs lies in the 1.3 micron fiber transmission window and the passband of another of the gain-clamped SOAs lies in the 1.55 micron fiber transmission window. Thus, the broadband SOA device can amplify optical signals in both transmission windows.

In one embodiment, the gain-clamped SOAs are vertically lasing semiconductor optical amplifiers (VLSOAs). In one variation, the VLSOAs are integrated on a common substrate. In another approach, they are contained in separate packages.

In further accordance with the invention, in a broadband SOA device including at least two SOAs, a method for amplifying an optical signal includes the following steps. The optical signal to be amplified is received. Each SOA is gain-clamped. At least portions of the optical signal propagate along amplifying paths in the gain-clamped SOAs. The amplification applied by each gain-clamped SOA has a different spectral response and the spectral response of the amplification applied by the broadband SOA device is not attainable by any individual gain-clamped SOA.

The present invention is particularly advantageous because the broadband SOA device can operate over a broader wavelength range than a single gain-clamped SOA. Since the broadband SOA device is based on semiconductors (as opposed to fibers, for example), the device is also small in size, potentially easy to manufacture using semiconductor fabrication technology, and easily integrable. The gain-clamping aspect of the individual amplifiers alleviates problems arising from gain saturation.

BRIEF DESCRIPTION OF THE DRAWING

The invention has other advantages and features which will be more readily apparent from the following detailed description of the invention and the appended claims, when taken in conjunction with the accompanying drawing.

FIGS. 6A–7B are block diagrams of more examples of broadband SOA devices.

DETAILED DESCRIPTION OF THE PREFERRED EMBODIMENTS

Figure 1:
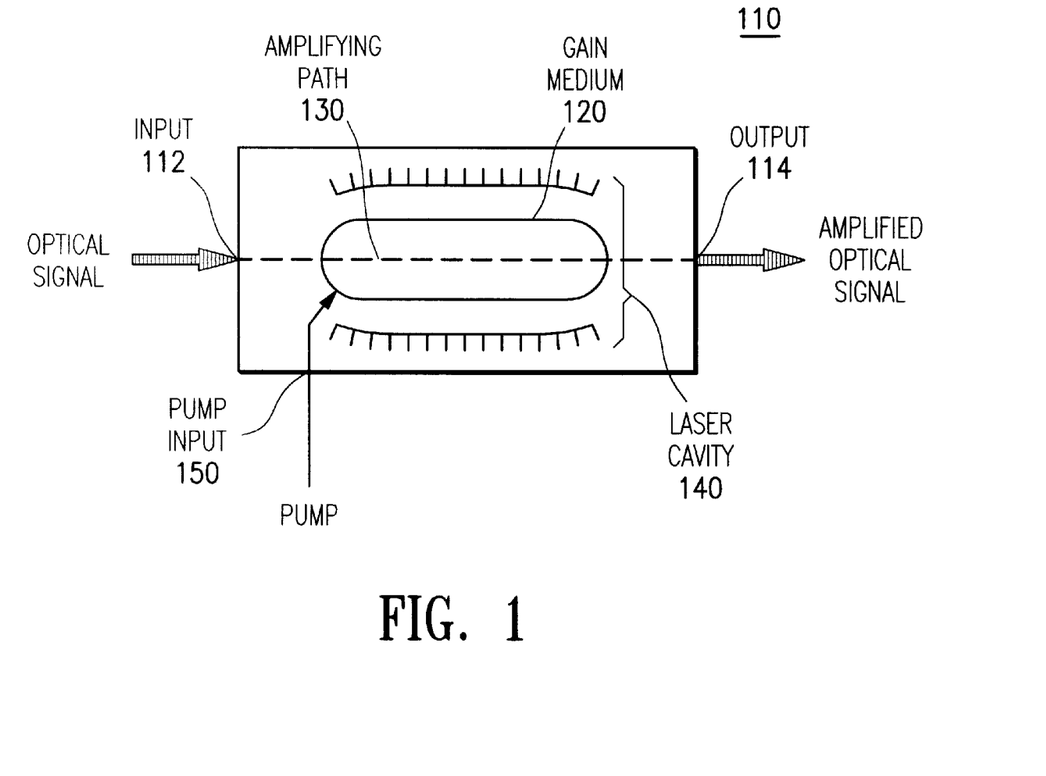
FIG. 1 is a diagram of a gain-clamped semiconductor optical amplifier (SOA).

FIG. 1 is a diagram of a gain-clamped semiconductor optical amplifier (SOA) 110. The gain-clamped SOA 110 has an amplifier input 112 and output 114. It also includes a semiconductor gain medium 120, with an amplifying path 130 from the input 112 to the output 114 and traveling through the semiconductor gain medium 120. The gain-clamped SOA 110 further includes a laser cavity 140 including the semiconductor gain medium 120, and a pump input 150 coupled to the semiconductor gain medium 120. The pump input 150 is for receiving a pump to pump the semiconductor gain medium 120 above a lasing threshold for the laser cavity 140.

In one variation, the laser cavity 140 is oriented vertically with respect to the amplifying path 130. This variation is referred to as a vertically lasing semiconductor optical amplifier (VLSOA). In another variation, the laser cavity 140 is oriented transversely with respect to the amplifying path 130—a transverse lasing semiconductor optical amplifier (TLSOA). In a third variation, the laser cavity 140 is aligned with the amplifying path 130—a longitudinally lasing semiconductor optical amplifier (LLSOA). In other variations, the laser cavity 140 is off-axis with respect to the amplifying path 130. Many of the following examples will be illustrated using VLSOAs as the gain-clamped SOA. However, this is not meant as a limitation and other types of gain-clamped SOAs can also be used.

Figure 2:
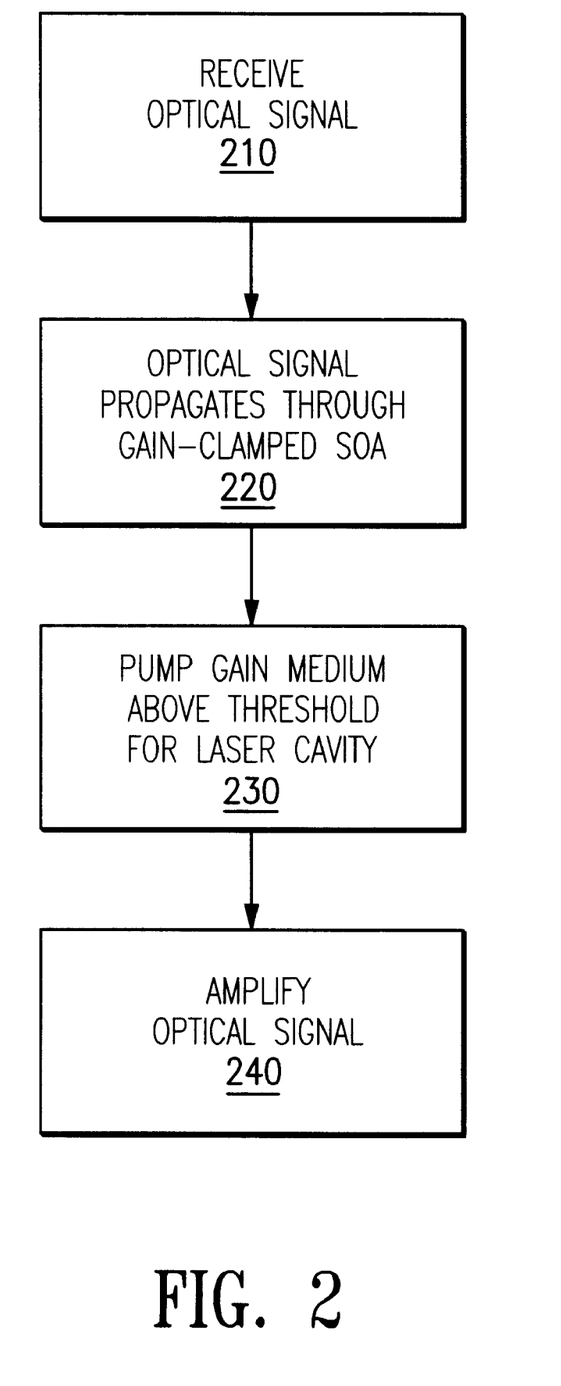
FIG. 2 is a flow diagram illustrating operation of the gain-clamped SOA of FIG. 1.

FIG. 2 is a flow diagram illustrating operation-of the gain-clamped SOA of FIG. 1. The gain-clamped SOA 110 receives 210 an optical signal at its input 112. The optical signal propagates 220 along the amplifying path 130. The pump received at pump input 150 pumps 230 the semiconductor gain medium above a lasing threshold for the laser cavity 140. When lasing occurs, the round-trip gain offsets the round-trip losses for the laser cavity 140. In other words, the semiconductor gain medium 120 is gain-clamped to the gain value necessary to offset the round-trip losses. The optical signal is amplified 240 according to this gain value as it propagates along the amplifying path 130 (i.e., through the semiconductor gain medium 120). The amplified signal exits the gain-clamped SOA 110 via the output 114.

Note that the gain experienced by the optical signal as it propagates through the gain-clamped SOA 110 is determined in part by the gain value of the semiconductor gain medium 120 (it is also determined, for example, by the length of the amplifying path 130) and this gain value, in turn, is determined primarily by the lasing threshold for the laser cavity 140. In particular, the gain experienced by the optical signal as it propagates through the gain-clamped SOA 110 is substantially independent of the amplitude of the optical signal. The amplifier is gain-clamped. This is in direct contrast to the situation with non-lasing SOAs (i.e., non gain-clamped SOAs) and overcomes the distortion and crosstalk disadvantages typical of non-lasing SOAs.

Figure 3:
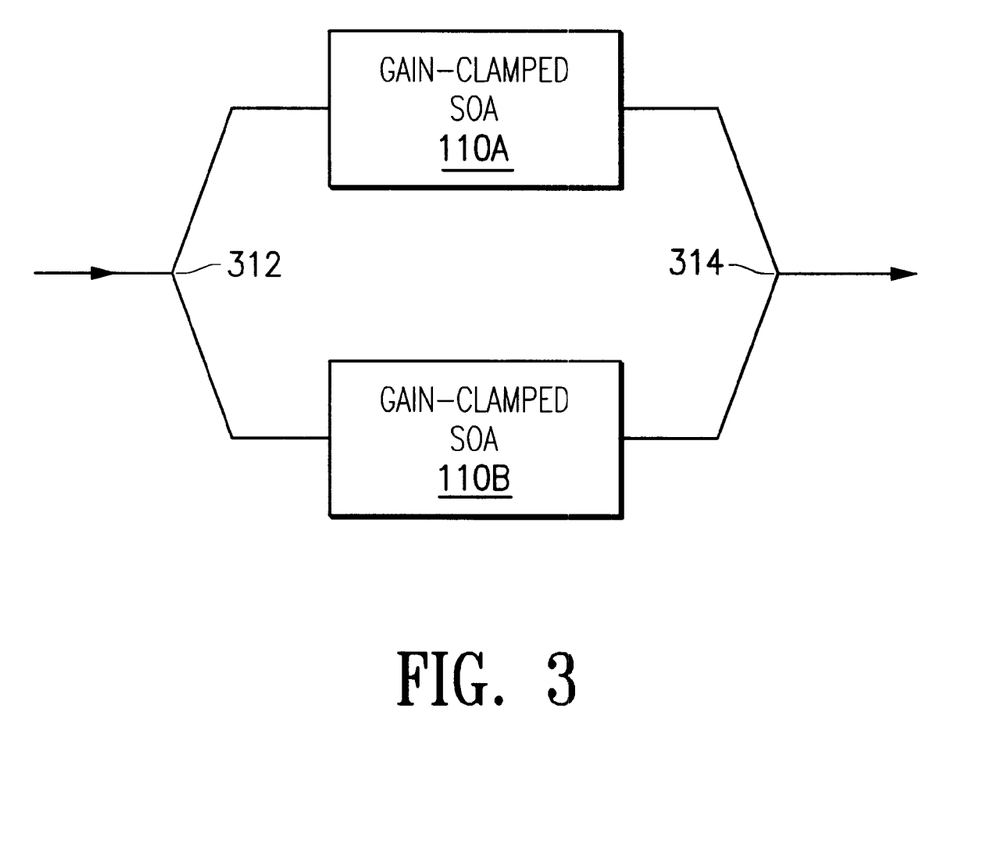
FIG. 3 is a block diagram of a broadband SOA device in which the gain-clamped SOAs are coupled in parallel.

FIG. 3 is a block diagram of a broadband SOA device 300 in which gain-clamped SOAs 110 are coupled in parallel. The two parallel gain-clamped SOAs 110 are coupled in series between an optical splitter 312 and an optical combiner 314. In one implementation, the optical splitter 312 is wavelength-selective. Examples of such devices include wavelength division demultiplexers, arrayed waveguide gratings, and optical power splitters coupled to appropriate wavelength filters. In another implementation, the optical splitter 312 is polarization sensitive. For example, the wavelength band destined for gain-clamped SOA 110A may have one polarization whereas the band destined for gain-clamped SOA 110B might have a different polarization. The wavelength-selective optical splitter 312 splits the incoming signal into two different wavelength bands, with a different band directed towards each gain-clamped SOA 110. Since each gain-clamped SOA 110 only amplifies a specific band within the original signal, the amplifier 110 can be optimized for that specific band. The optical combiner 314 then recombines the individually amplified bands. In one implementation, the optical combiner 314 is a 1:N optical power combiner (i.e., no wavelength-selectivity). In another, it is wavelength-selective, such as a wavelength division demultiplexer, and/or polarization-selective. The spectral responses of the optical splitter 312 and optical combiner 314 may be designed to be different so that the overall response is smoother in terms of gain versus wavelength. By combining SOAs in parallel, the total output power can also be increased.

Figure 4A:
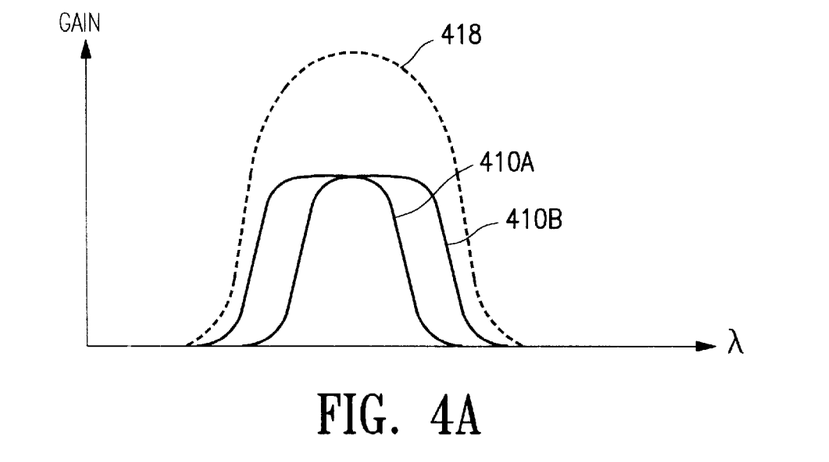
FIGS. 4A–4C are spectral responses of various implementations of the broadband SOA device of FIG. 3.
Figure 4B:
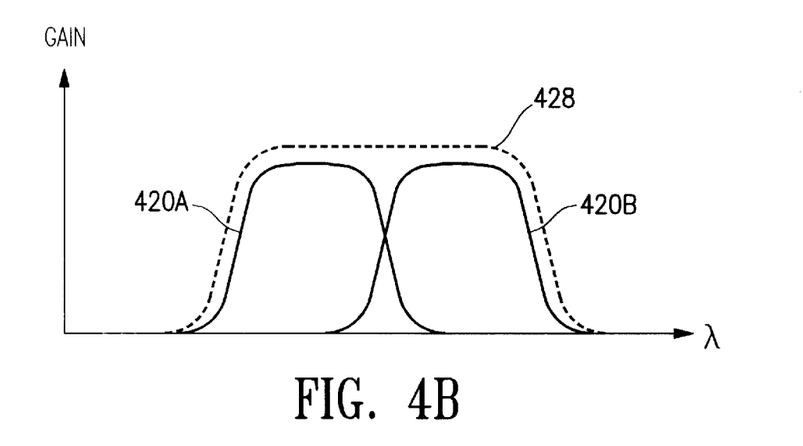
Figure 4C:
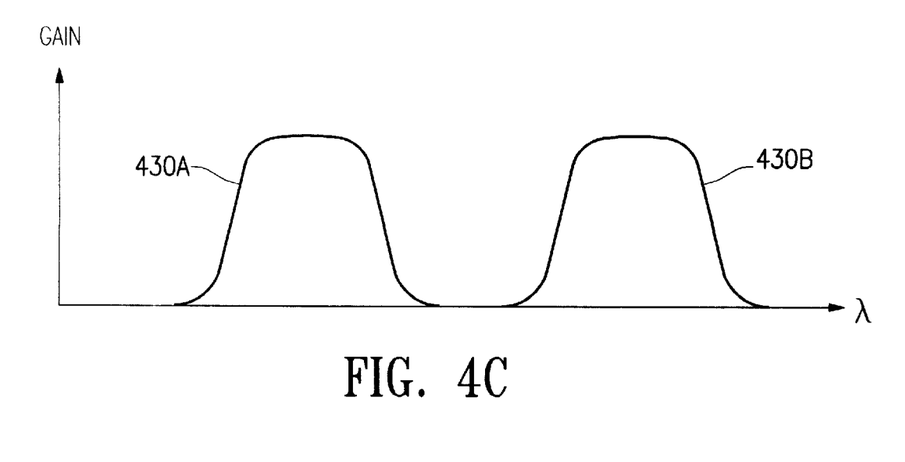

FIGS. 4A–4C are spectral responses of various implementations of the broadband SOA device 300. In FIG. 4A, the gain curves 410A and 410B for the gain-clamped SOAs 110A and 110B are overlapping. If the corresponding wavelength bands received by the SOAs 110 also contained overlapping wavelengths, there might be intereference effects. One way to mitigate these intereference effects is to split and recombine the wavelength bands based on polarization. Then, even if the wavelength bands were overlapping, any interference would be reduced since the wavelength bands have different polarizations. Another approach is to design the optical splitter 312 and/or optical combiner 314 so that the two wavelength bands do not significantly overlap. In other words, SOA 110A receives one wavelength band and SOA 110A receives another wavelength band which does not overlap significantly. For example, the, wavelength bands could be centered around different wavelengths on the ITU grid by using wavelength interleavers for the splitter 312 and combiner 314.

In FIG. 4B, the gain curves 420A and 420B are not significantly overlapping, but they are contiguous. As a result, the overall gain curve 428 covers one continuous band of wavelengths. For example, the individual gain curves 420 might cover different parts of the 1.55 micron fiber transmission window. The overall bandwidth is typically determined by the amount of gain variation versus wavelength which can tolerated. For example, a single gain-clamped SOA typically may exhibit a 1 dB gain flatness over a bandwidth of 40 nm and a 3 dB gain flatness over a bandwidth of roughly 80 nm. By combining two such gain-clamped SOAs as shown in FIG. 4B, the overall device can achieve a 1 dB gain flatness over a bandwidth of 80 nm and a 3 dB gain flatness over 160 nm. In some implementations, a guard band is used to avoid interference effects, depending in part on the spectral responses of the optical splitter 312 and optical combiner 314.

In FIG. 4C, the gain curves 430A and 430B are non-overlapping. For example, in one implementation, curve 430A lies in the 1.3 micron fiber transmission window whereas gain curve 430B lies in the 1.55 micron fiber transmission window. Note that in these examples, the passband of the overall device 300 is broader than the passband of each individual amplifier 110.

In another implementation, the optical splitter 312 is an optical power splitter, meaning that it is not wavelength selective. As a result, the received optical signal is split into multiple identical (in spectral content) subsignals, one directed towards each gain-clamped SOA 110. The amplifiers 110 amplify these subsignals, which are then recombined by the optical combiner 314. Each amplifier 110 could amplify the entire subsignal. Alternately, each amplifier could be optimized for a different wavelength band within the subsignal and may even block the other wavelength bands. This variant is easier and less costly to fabricate but has lower performance due to the wavelength insensitivity of the power splitter.

Figure 5:
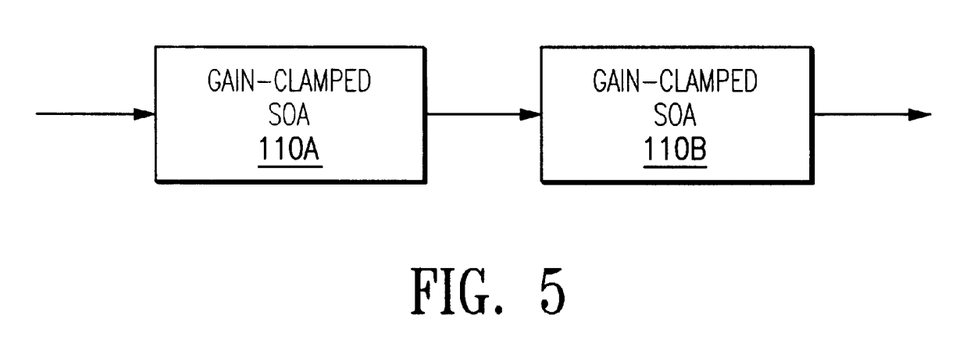
FIG. 5 is a block diagram of a broadband SOA device in which the gain-clamped SOAs are coupled in series

FIG. 5 is a block diagram of a broadband SOA device 350 in which the gain-clamped SOAs 110 are coupled in series. Each amplifier 110 is optimized to amplify light within a specific wavelength band and to pass light of other wavelength bands. Thus, the overall device 350 has a broader spectral response. Gain-clamped SOAs 110 typically are absorptive at wavelengths which are shorter than their operating wavelengths. Hence, it is preferable to place the shorter wavelength amplifiers earlier in the series. This avoids some absorption of the shorter wavelength light by other amplifiers and also reduces the amount of noise introduced by other amplifiers. In the case of a multi-stage amplifier designed for low-noise figure, high gain, and high output power, this arrangement also lends itself to a broader wavelength range of operation since using a single type of active region, the higher inversion amplifier (shorter wavelengths) will be at the beginning of the device.

FIGS. 3–5 are basic examples of broadband SOA devices based on combining two gain-clamped SOAs 110. The invention is not limited to these specific configurations or the specific numbers given. For example, the broadband SOA device may use more than two gain-clamped SOAs. Other wavelength regions, spectral bands and spectral responses may be used. The gain-clamped SOAs may all have different spectral responses, or not. It is not feasible to explicitly list all the ways in which two or more gain-clamped SOAs with different spectral responses can be coupled together to form a broadband SOA device with a spectral response not attainable by the individual gain-clamped SOAs. Thus, the configurations shown above and also those which follow are to be taken as examples illustrating basic principles which will apply equally to other implementations.

Figure 6A:
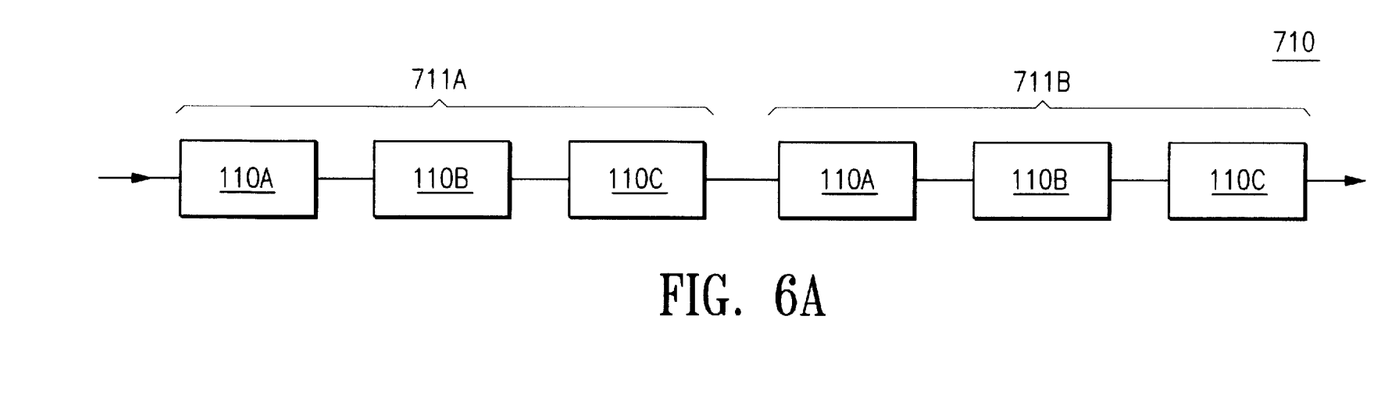

For example, FIGS. 6A–7B are block diagrams of more examples of broadband SOA devices according to the invention. In FIG. 6A, the broadband SOA device 710 includes six gain-clamped SOAs 110A–110C coupled in series. This configuration is similar to device 350 of FIG. 5, except that there are more amplifiers and some of the amplifiers have the same spectral response. For example, although each of the amplifiers 110A–110C has a different spectral response, there are two of each of the amplifiers 110A–110C. Thus, the device 710 can be though of as having two identical stages 711A and 711B, each composed of three gain-clamped SOAs 110A–110C in series. In alternate embodiments, the stages 711 may differ. For example, each stage may have the same spectral response but be optimized for a different power level. Or they may differ even in spectral response.

Figure 6B:
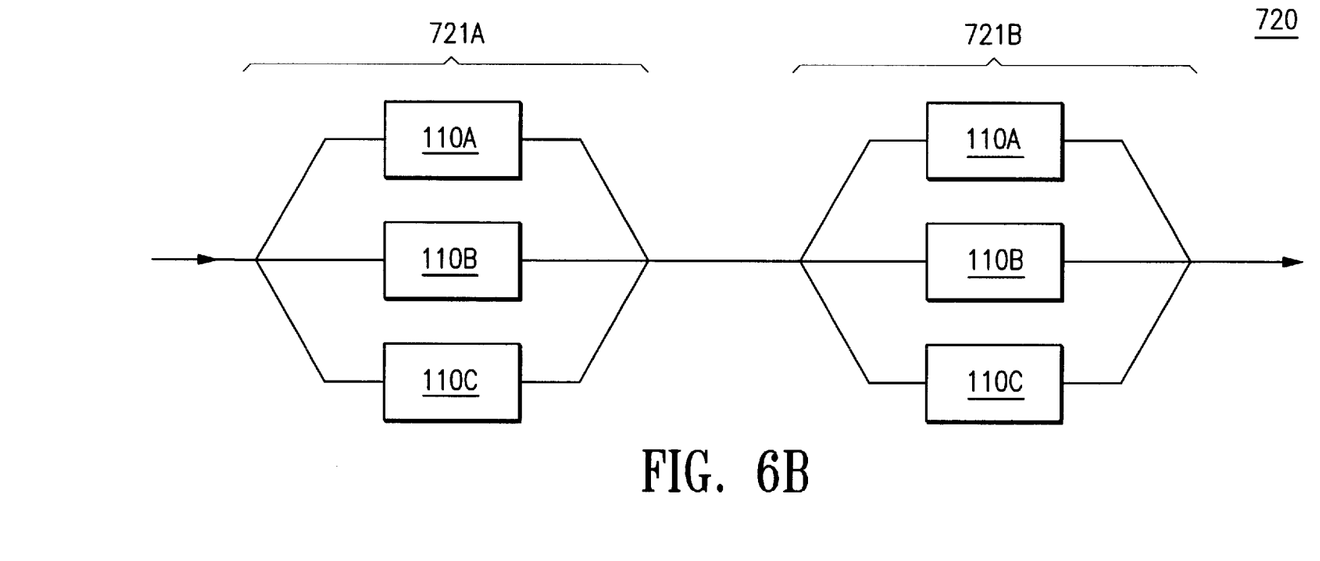

Device 720 of FIG. 6B also has two stages 721A–721B coupled in series. However, in this example, each stage 721 consists of three gain-clamped SOAs 110A–110C coupled in parallel. Device 730 of FIG. 7A has two stages 731A–731B coupled in parallel, and each stage 731 consists of gain-clamped SOAs 110 coupled in series. Device 740 of FIG. 7B has two stages 741A–741B coupled in parallel, and each stage 741 consists of gain-clamped SOAs 110 coupled in parallel.

Figure 7A:
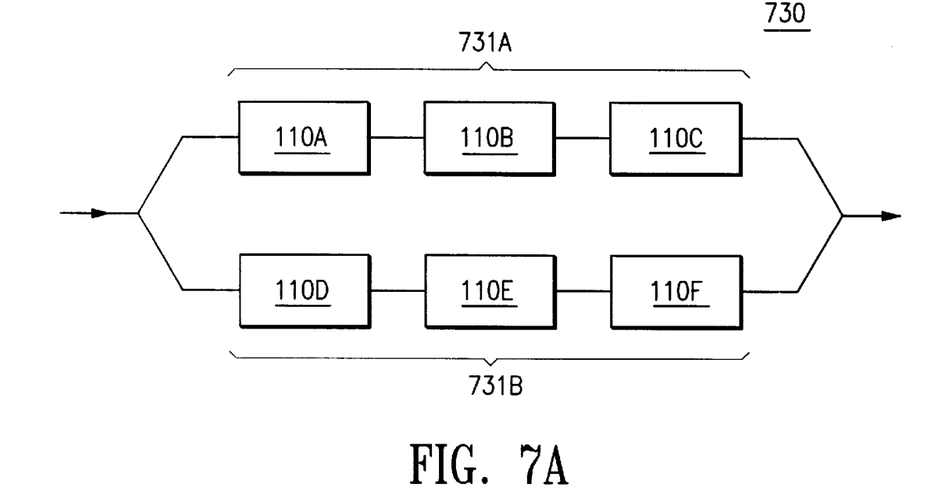
Figure 7B:
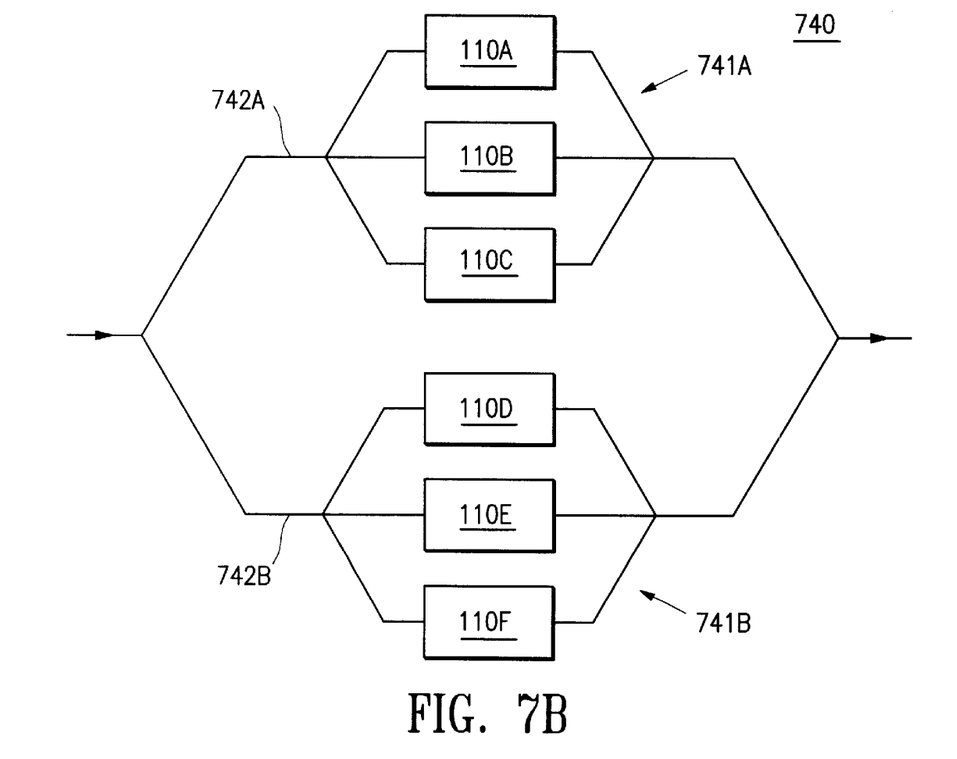

Again, the devices shown in FIGS. 6–7 are merely examples based on two stages of three gain-clamped SOAs each. Other variations will be apparent. For example, device 740 of FIG. 7B has a tree structure. Thus, in one variation, amplifiers may be located at different places along the branches, for example at locations 742A–742B. As another example, FIGS. 6A–7B have regular, symmetric topologies. Each stage has the same number of gain-clamped SOAs coupled in the same configuration. These examples were selected to illustrate different types of configurations for stages and amplifiers within stages. The use of these examples is not meant to limit the invention to regular or symmetric topologies.

As a final example, the block diagrams for the broadband SOA devices have shown gain-clamped SOAs 110 and signal splitters/combiners but no other components. This is done for clarity. It does not imply that the devices are limited only to the components shown. For example, wavelength filters may be incorporated at various locations for various purposes: to eliminate unwanted signal components, to enhance the wavelength selectivity of the splitter/combiner or the gain characteristics of the amplifiers, or to reduce noise produced by the amplifiers or other components, to name a few examples. Similarly, isolators, non gain-clamped optical amplifiers and other components may also be incorporated into the broadband SOA device. The spectral response of the overall device typically will depend on the spectral responses of these other components as well as the gain-clamped SOAs and splitters/combiners and the overall spectral response can be tailored by tailoring the spectral responses of the different components.

Figure 8A:
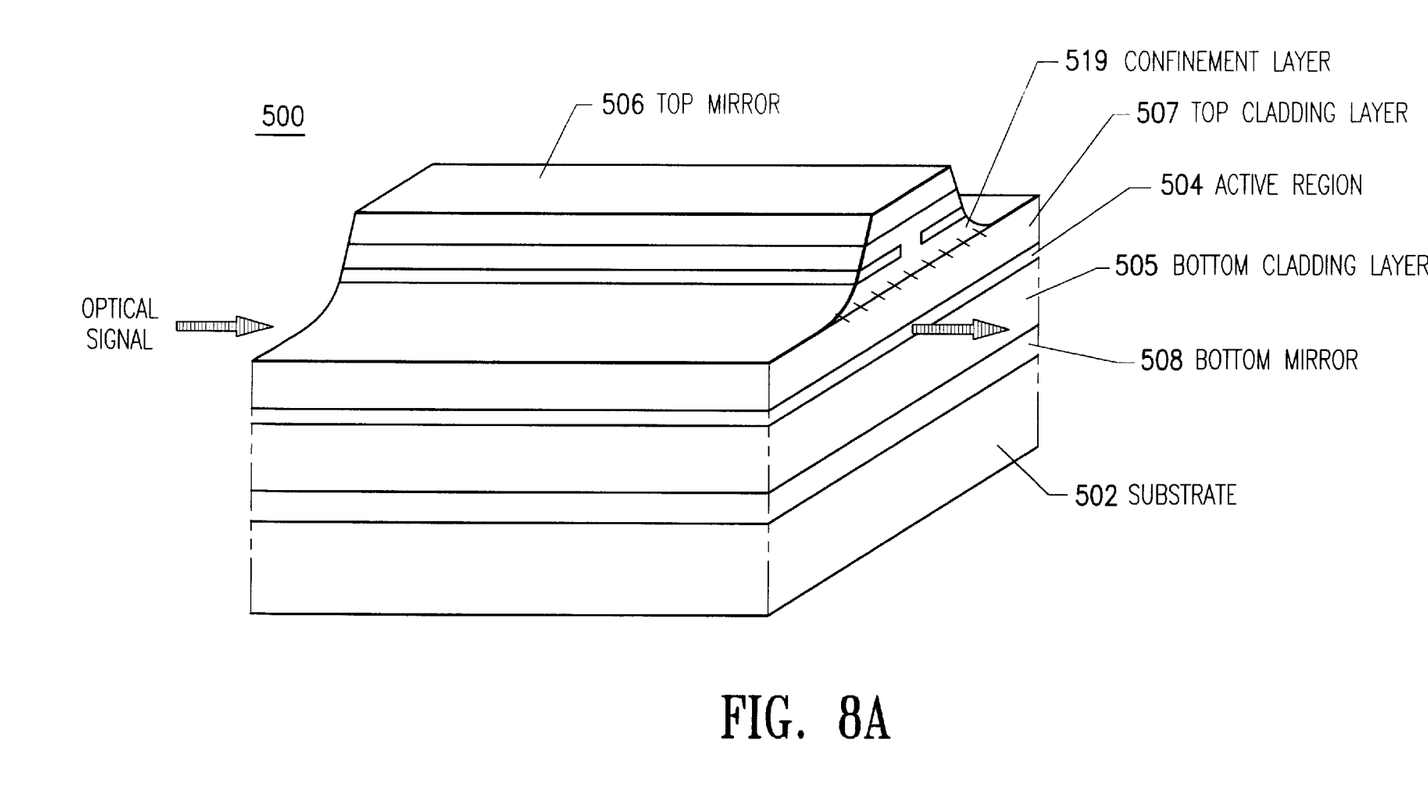
FIGS. 8A–8C are a perspective view, transverse cross-sectional view, and a longitudinal cross-sectional view of one implementation of a vertically lasing semiconductor optical amplifier (VLSOA).
Figure 8B:
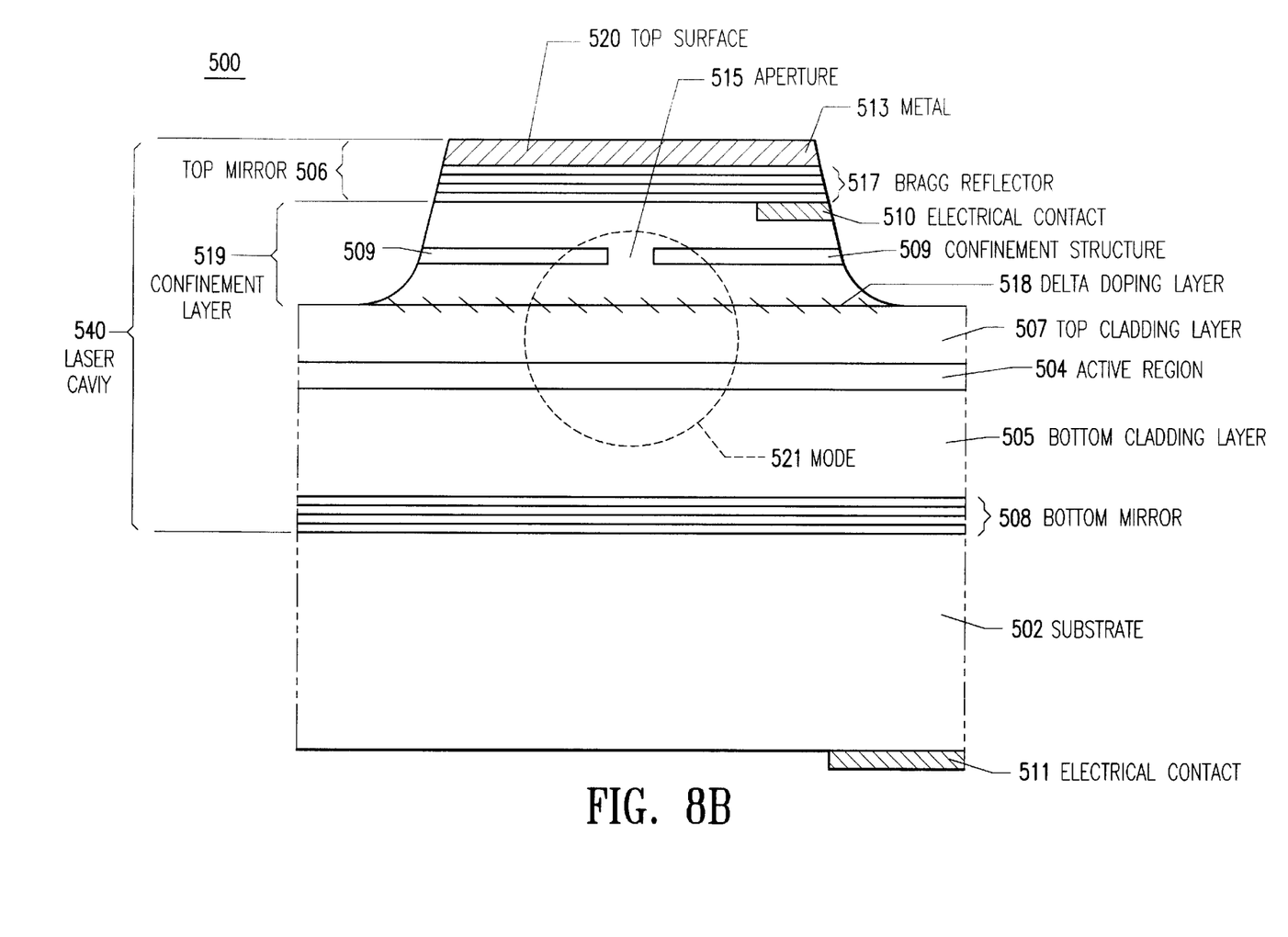
Figure 8C:
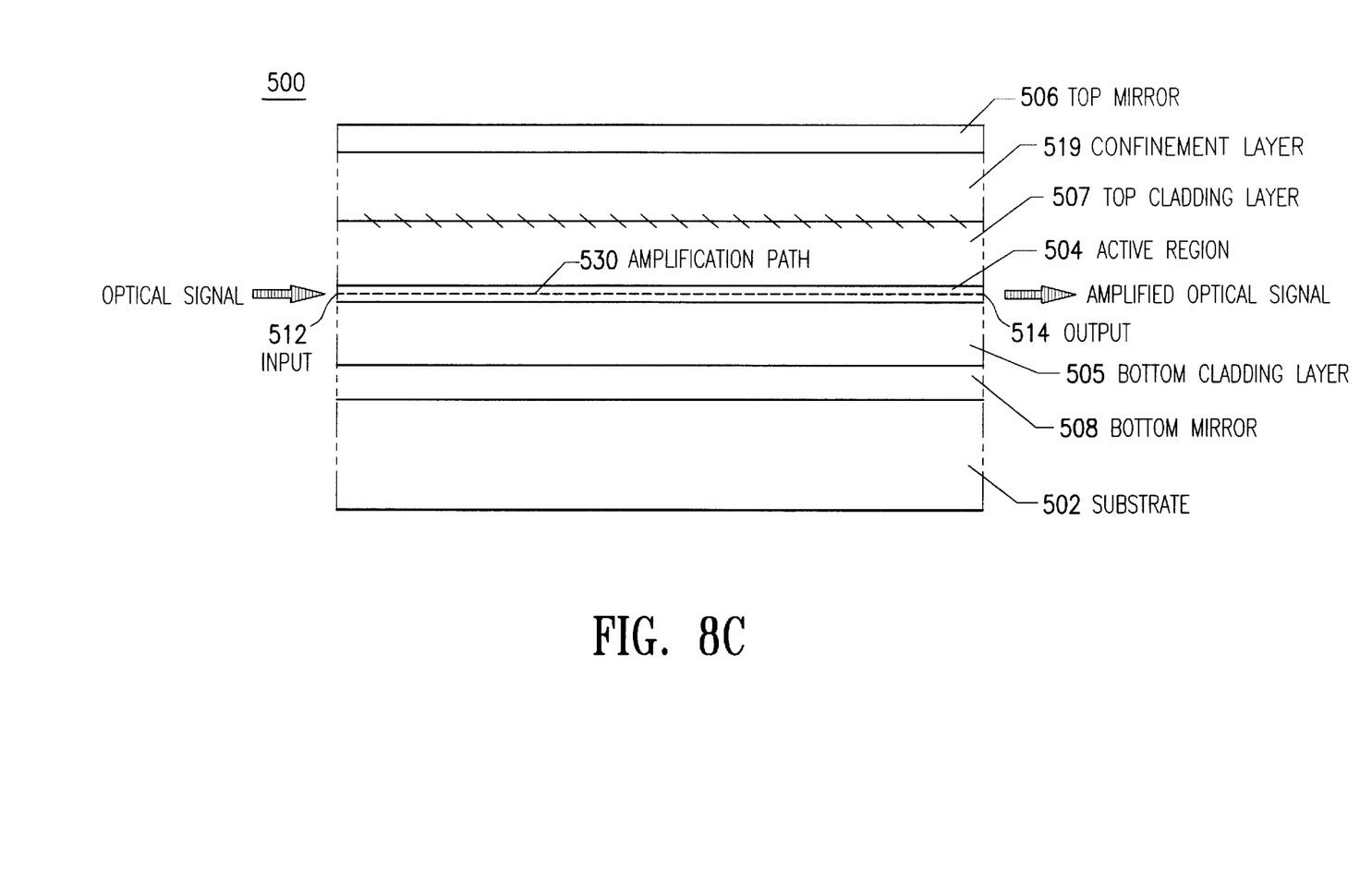

In one implementation, the gain-clamped SOAs are implemented as vertically lasing semiconductor optical amplifiers (VLSOA). FIGS. 8A–8C are a perspective view, transverse cross-sectional view, and a longitudinal cross-sectional view of one implementation of a VLSOA, with FIG. 8B showing the most detail.

Referring to FIG. 8B and working from bottom to top in the vertical direction (i.e., working away from the substrate 502), VLSOA 500 includes a bottom mirror 508, bottom cladding layer 505, active region 504, top cladding layer 507, confinement layer 519, and a top mirror 506. The bottom cladding layer 505, active region 504, top cladding layer 507, and confinement layer 519 are in electrical contact with each other and may be in direct physical contact as well. An optional delta doping layer 518 is located between the top cladding layer 507 and confinement layer 519. The confinement layer 519 includes a confinement structure 509, which forms aperture 515. The VLSOA 500 also includes an electrical contact 510 located above the confinement structure 509, and a second electrical contact 511 formed on the bottom side of substrate 502.

Comparing to FIG. 1, the semiconductor gain medium 120 includes the active region 504 and the laser cavity 140 is formed primarily by the two mirrors 506 and 508 and the active region 504. This embodiment is electrically pumped so the pump input 150 includes the electrical contacts 510,511.

VLSOA 500 is a vertically lasing semiconductor optical amplifier since the laser cavity 540 is a vertical laser cavity. That is, it is oriented vertically with respect to the amplifying path 530 and substrate 502. The VLSOA 500 preferably is long in the longitudinal direction, allowing for a long amplifying path 530 and, therefore, more amplification. The entire VLSOA 500 is an integral structure formed on a single substrate 502 and may be integrated with other optical elements, including other VLSOAs and optical splitters and combiners. In most cases, optical elements which are coupled directly to VLSOA 500 will be coupled to the amplifying path 530 within the VLSOA. Depending on the manner of integration, the optical input 512 and output 514 may not exist as a distinct structure or facet but may simply be the boundary between the VLSOA 500 and other optical elements. Furthermore, although FIG. 5 is discussed in the context of a single VLSOA 500, the teachings herein apply equally to arrays of VLSOAs.

VLSOA 500 is a layered structure, allowing the VLSOA 500 to be fabricated using standard semiconductor fabrication techniques, preferably including organo-metallic vapor phase epitaxy (OMVPE) or organometallic chemical vapor deposition (OMCVD). Other common fabrication techniques include molecular beam epitaxy (MBE), liquid phase epitaxy (LPE), photolithography, e-beam evaporation, sputter deposition, wet and dry etching, wafer bonding, ion implantation, wet oxidation, and rapid thermal annealing, among others.

The optical signal amplified by the VLSOA 500 is confined in the vertical direction by index differences between bottom cladding 505, active region 504, and top cladding 507, and to a lesser extent by index differences between the substrate 502, bottom mirror 508, confinement layer 519, and top mirror 506. Specifically, active region 504 has the higher index and therefore acts as a waveguide core with respect to cladding layers 505,507. The optical signal is confined in the transverse direction by index differences between the confinement structure 509 and the resulting aperture 515. Specifically, aperture 515 has a higher index of refraction than confinement structure 509. As a result, the mode of the optical signal to be amplified is generally concentrated in dashed region 521. The amplifying path 530 is through the active region 504 in the direction in/out of the plane of the paper with respect to FIG. 8B.

The choice of materials system will depend in part on the wavelength of the optical signal to be amplified, which in turn will depend on the application. Wavelengths in the approximately 1.3–1.6 micron region are currently preferred for telecommunications applications, due to the spectral properties of optical fibers. In particular, there currently are two common transmission windows for optical fiber: one at approximately 1.3 micron and another at approximately 1.55 micron. The 1.55 micron window currently can include shorter wavelengths (e.g., the S-band, 1450–1530 nm), centered wavelengths (e.g., C-band 1530–1560 nm), or longer wavelengths (e.g., L-band 1570–1610 nm). In addition, the approximately 1.28–1.35 micron region is currently also preferred for data communications over single mode fiber, with the approximately 0.8–1.1 micron region being an alternate wavelength region. The term "optical" is meant to include all of these wavelength regions.

In one embodiment, the active region 504 includes a multiple quantum well (MQW) active region. MQW structures include several quantum wells and quantum wells have the advantage of enabling the formation of lasers with relatively low threshold currents. In alternate embodiments, the active region 504 may instead be based on a single quantum well or a double-heterostructure active region. The active region 504 may be based on various materials systems, including for example InAlGaAs on InP substrates, InAlGaAs on GaAs, InGaAsP on InP, GaInNAs on GaAs, InGaAs on ternary substrates, and GaAsSb on GaAs. Nitride material systems are also suitable. The materials for bottom and top cladding layers 505 and 507 will depend in part on the composition of active region 504.

Examples of top and bottom mirrors 506 and 508 include Bragg reflectors and non-Bragg reflectors such as metallic mirrors. Bottom mirror 508 in FIG. 8 is shown as a Bragg reflector. Top mirror 506 is depicted as a hybrid mirror, consisting of a Bragg reflector 517 followed by a metallic mirror 513. Bragg reflectors may be fabricated using various materials systems, including for example, alternating layers of GaAs and AlAs, $SiO_2$ and $TiO_2$, InAlGaAs and InAlAs, InGaAsP and InP, AlGaAsSb and AlAsSb or GaAs and AlGaAs. Gold is one material suitable for metallic mirrors. The electrical contacts 510,511 are metals that form an ohmic contact with the semiconductor material. Commonly used metals include titanium, platinum, nickel, germanium, gold, palladium, and aluminum. In this embodiment, the laser cavity is electrically pumped by injecting a pump current via the electrical contacts 510,511 into the active region 504. In particular, contact 510 is a p-type contact to inject holes into active region 504, and contact 511 is an n-type contact to inject electrons into active region 504. Contact 510 is located above the semiconductor structure (i.e., above confinement layer 519 and the semiconductor part of Bragg reflector 517, if any) and below the dielectric part of Bragg reflector 517, if any. For simplicity, in FIG. 8, contact 510 is shown located between the confinement layer 519 and Bragg reflector 517, which would be the case if Bragg reflector 517 were entirely dielectric. VLSOA 500 may have a number of isolated electrical contacts 510 to allow for independent pumping within the amplifier. This is advantageous because VLSOA 500 is long in the longitudinal direction and independent pumping allows, for example, different voltages to be maintained at different points along the VLSOA. Alternately, the contacts 510 may be doped to have a finite resistance or may be separated by finite resistances, rather than electrically isolated.

Confinement structure 509 is formed by wet oxidizing the confinement layer 519. The confinement structure 509 has a lower index of refraction than aperture 515. Hence, the effective cross-sectional size of laser cavity 540 is determined in part by aperture 515. In other words, the confinement structure 509 provides lateral confinement of the optical mode of laser cavity 540. In this embodiment, the confinement structure 509 also has a lower conductivity than aperture 515. Thus, pump current injected through electrical contact 510 will be channeled through aperture 515, increasing the spatial overlap with optical signal 521. In other words, the confinement structure 509 also provides electrical confinement of the pump current.

VLSOA 500 operates as shown in FIG. 2. An optical signal is received 210 at the VLSOA input 512. The optical signal propagates 220 along the amplifying path 530. The pump current received at electrical contacts 510,511 pumps 230 the semiconductor active region 504 above a lasing threshold for the laser cavity 540. When lasing occurs, the round-trip gain offsets the round-trip losses for the laser cavity 540. In other words, the active region 504 is gain-clamped to the gain value necessary to offset the round-trip losses. The optical signal is amplified 240 according to this gain value as it propagates along the amplifying path 530 (i.e., through the active region 504). The amplified signal exits the VLSOA 500 via the output 514.

In one implementation of the broadband SOA devices shown in FIGS. 3–7, the gain-clamped SOAs 110 are implemented as individually packaged VLSOAs. For example, referring to FIG. 3, each gain-clamped SOA 110A–110B may be implemented as a VLSOA in its own package with fiber pigtails. The optical splitter 312 and optical combiner 314 may also be separately packaged with fiber pigtails. The fiber pigtails are spliced together to create the broadband SOA device 300.

In another implementation of the broadband SOA devices shown in FIGS. 3–7, the gain-clamped SOAs 110 are implemented as VLSOAs which are integrated on a common substrate. Other components may also be integrated on the same substrate. Integration of components (including VLSOAs) may be implemented using any number of techniques. In one approach, the components are formed using a common fabrication process on a common substrate, but with at least one parameter varying between the components. For example, selective area epitaxy (SAE) and impurity induced disordering (IID) are two fabrication processes which may be used in this manner.

In one approach based on SAE, a nitride or oxide SAE mask is placed over selected areas of the substrate. Material is deposited on the masked substrate. The SAE mask results in a difference between the transition energy (e.g., the bandgap energy) of the material deposited on a first unmasked area of the substrate and the transition energy of the material deposited on a second unmasked area of the substrate. For example, the material deposited on the first unmasked area might form part of the active region of the VLSOA and the material deposited on the second unmasked area might form part of the core of a waveguide, with the difference in transition energy accounting for the different optical properties of the active region and the transparent core. SAE is particularly advantageous because it results in a smooth interface between optical elements and therefore reduces optical scattering at this interface, This, in turn, reduces both parasitic lasing modes and gain ripple. Furthermore, the SAE approach can be confined to only the minimum number of layers necessary (e.g., only the active region), thus minimizing the impact on the rest of the integrated optical device.

In a different approach based on IID, an IID mask is placed over selected areas of the substrate. The masked substrate is bombarded with impurities, such as silicon or zinc, and subsequently annealed to cause disordering and intermixing of the materials in the bombarded region. The IID mask results in a difference between the transition energy of the material underlying a masked area of the substrate and the transition energy of the material underlying an unmasked area of the substrate. Continuing the previous example, the masked area might form part of the VLSOA active region and the unmasked area might form part of the core of a waveguide, with the difference in transition energy again accounting for the different optical properties.

In the previous SAE and IID examples, the difference in transition energy results in different optical properties between the VLSOA active region and a waveguide. Engineering the transition energy may also be used to integrate other components. For example, changing the transition energy between two VLSOAs can be used to optimize each VLSOA for a different wavelength band, even one VLSOA for the 1.3 $\mu$m band and another for the 1.55 $\mu$m band. This technique may also be used to grade the transition energy in a VLSOA in a controlled way to broaden, flatten, or otherwise shape the gain profile.

In a different approach, the components are formed on a common substrate but using different fabrication processes. In one example, the first component is formed on the common substrate in part by depositing a first set of materials on the substrate. Next, the deposited material is removed from selected areas of the substrate, for example by an etching process. A second set of materials is deposited in the selected areas to form the second optical component. Etch and fill is one process which follows this approach. Continuing the VLSOA and waveguide example from above, materials are deposited to form the VLSOA (or at least a portion of the VLSOA). In the areas where the waveguide is to be located, these materials are removed and additional materials are deposited to form the waveguide (or at least a portion of it).

In yet another approach, the components are formed on separate substrates by separate fabrication processes and then integrated onto a common substrate. Planar lightwave circuitry and silicon optical bench are two examples of processes following this approach. In the VLSOA and waveguide example, the VLSOA is formed on a first substrate. The waveguide is formed on a second substrate. The VLSOA and the waveguide are then integrated onto a common substrate, which could be the first substrate, the second substrate or a completely different substrate. In one implementation, pits are formed in the substrate containing the waveguides. The VLSOAs are then transferred to this substrate by locating the VLSOAs into the pits.

Although the invention has been described in considerable detail with reference to certain preferred embodiments thereof, other embodiments are possible. Therefore, the scope of the appended claims should not be limited to the description of the preferred embodiments contained herein.

What is claimed is:

1. A broadband semiconductor optical amplifier (SOA) device comprising at least two gain-clamped SOAs having different spectral responses, wherein the gain-clamped SOAs are coupled so that the broadband SOA device has a spectral response not attainable by any one of the gain-clamped SOAs.

2. The broadband SOA device of claim 1 wherein the broadband SOA device has a passband which is broader than a passband of any one of the gain-clamped SOAs.

3. The broadband SOA device of claim 2 wherein the passbands of the gain-clamped SOAs are non-overlapping.

4. The broadband SOA device of claim 2 wherein:

the passband of one of the gain-clamped SOAs lies in the 1.3 micron fiber transmission window; and the passband of another of the gain-clamped SOAs lies in the 1.55 micron fiber transmission window.

5. The broadband SOA device of claim 1 wherein the gain-clamped SOAs are vertically lasing semiconductor optical amplifiers (VLSOAs).

6. The broadband SOA device of claim 5 wherein the VLSOAs are coupled in parallel.

7. The broadband SOA device of claim 6 further comprising:

an optical power splitter coupled to inputs of the VLSOAs for splitting a received optical signal into multiple subsignals, one for each VLSOA; and an optical combiner coupled to outputs of the VLSOAs for recombining the amplified subsignals.

8. The broadband SOA device of claim 6 further comprising:

an wavelength-selective optical splitter coupled to inputs of the VLSOAs for receiving a multi-band optical signal and directing a different band of the multi-band optical signal to each VLSOA; and an optical combiner coupled to outputs of the VLSOAs for recombining the amplified bands.

9. The broadband SOA device of claim 5 wherein the VLSOAs are coupled in series.

10. The broadband SOA device of claim 9 wherein:

the broadband SOA device has a passband which is broader than a passband of any one of the VLSOAs; and the passbands of the VLSOAs are overlapping.

11. The broadband SOA device of claim 5 further comprising:

at least two optical amplifier stages, wherein each optical amplifier stage comprises at least two VLSOAs having different spectral responses coupled so that the optical amplifier stage has a spectral response not attainable by any one of said VLSOAs.

12. The broadband SOA device of claim 5 wherein the VLSOAs are integrated on a common substrate.

13. The broadband SOA device of claim 5 wherein the VLSOAs are contained in separate packages.

14. In a broadband semiconductor optical amplifier (SOA) device comprising at least two SOAs, a method for amplifying an optical signal comprising:

receiving the optical signal;

clamping a gain of each SOA; and propagating at least portions of the optical signal along amplifying paths in the gain-clamped SOAs, wherein an amplification applied by each gain-clamped SOA has a different spectral response, and a spectral response of an amplification applied by the broadband SOA device is not attainable by any one of the gain-clamped SOAs.

15. The method of claim 14 wherein the amplification applied by the broadband SOA device has a passband which is broader than a passband of any one of the gain-clamped SOAs.

16. The method of claim 15 wherein the passbands of the gain-clamped SOAs are non-overlapping.

17. The method of claim 15 wherein:

the passband of one of the gain-clamped SOAs lies in the 1.3 micron fiber transmission window; and the passband of another of the gain-clamped SOAs lies in the 1.55 micron fiber transmission window.

18. The method of claim 14 wherein:

each SOA includes a semiconductor gain medium, a vertical laser cavity including the semiconductor gain medium, and a horizontal amplifying path traversing the semiconductor gain medium; and the step of clamping a gain of each SOA comprises:

pumping the semiconductor gain medium above a lasing threshold for the vertical laser cavity, whereby the semiconductor gain medium is gain clamped.

19. The method of claim 18 wherein the step of propagating at least portions of the optical signal along amplifying paths in the gain-clamped SOAs comprises:

splitting the received optical signal into multiple subsignals;

propagating each subsignal along an amplifying path in a gain-clamped SOA; and recombining the amplified subsignals.

20. The method of claim 18 wherein the step of propagating at least portions of the optical signal along amplifying paths in the gain-clamped SOAs comprises:

splitting the received optical signal into multiple bands by wavelength;

propagating each band along an amplifying path in a gain-clamped SOA; and recombining the amplified bands.

21. The method of claim 18 wherein the step of propagating at least portions of the optical signal along amplifying paths in the gain-clamped SOAs comprises:

propagating the entire received optical signal along an amplifying path in a first gain-clamped SOA; and propagating the amplified received optical signal along an amplifying path in a second gain-clamped SOA.

22. The method of claim 18 wherein the gain-clamped SOAs are integrated on a common substrate.

* * * * *